US009762228B2

(12) United States Patent
Agrawal et al.

(10) Patent No.: US 9,762,228 B2
(45) Date of Patent: Sep. 12, 2017

(54) HIGH-SPEED PROGRAMMABLE CLOCK DIVIDER

(71) Applicant: QUALCOMM Incorporated, San Diego, CA (US)

(72) Inventors: Neha Agrawal, Bangalore KRN (IN); Sajin Mohamad, Bangalore KRN (IN); Chulkyu Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 112 days.

(21) Appl. No.: 14/855,238

(22) Filed: Sep. 15, 2015

(65) Prior Publication Data

US 2017/0077918 A1    Mar. 16, 2017

(51) Int. Cl.
| | |
|---|---|
| *H03K 21/00* | (2006.01) |
| *H03K 7/06* | (2006.01) |
| *H03K 19/21* | (2006.01) |
| *H03K 3/037* | (2006.01) |
| *H03K 21/10* | (2006.01) |
| *H03K 23/64* | (2006.01) |
| *H03K 23/00* | (2006.01) |

(Continued)

(52) U.S. Cl.
CPC ............... *H03K 7/06* (2013.01); *H03K 3/037* (2013.01); *H03K 19/21* (2013.01); *H03K 21/10* (2013.01); *H03K 23/64* (2013.01); *G06F 1/08* (2013.01); *H03K 21/00* (2013.01); *H03K 21/026* (2013.01); *H03K 23/00* (2013.01)

(58) Field of Classification Search
None
See application file for complete search history.

(56) References Cited

U.S. PATENT DOCUMENTS 4,623,846 A * 11/1986 LaMacchia ............ H03K 21/10
                                                            327/114
5,362,119 A * 11/1994 Rosenratter .......... B60J 1/2063
                                                            160/DIG. 3

(Continued)

FOREIGN PATENT DOCUMENTS

EP        2806562 A1    11/2014

OTHER PUBLICATIONS

International Search Report and Written Opinion—PCT/US2016/046333—ISA/EPO—dated Nov. 21, 2016.

*Primary Examiner* — Tuan T Lam
(74) *Attorney, Agent, or Firm* — Procopio, Cory, Hargreaves & Savitch LLP

(57) ABSTRACT

Systems and methods for dividing input clock signals by programmable divide ratios can produce output clock signals with the delay from the input clock signal to the output clock signal independent of the value of the divide ratio and with the duty cycle of the output clock signal being 50% independent of the value of the divide ratio. An example programmable clock divider includes a modulo N counter that produces a count signal that counts modulo the divide ratio and a half-rate clock signal generator that produces a common half-rate clock signal, an even half-rate clock signal, and an odd half-rate clock signal that toggle at one-half the rate of the output clock signal. The common half-rate clock signal, the even half-rate clock signal, and the odd half-rate clock signal are combined to produce the output clock signal.

21 Claims, 3 Drawing Sheets

(51) Int. Cl.
*H03K 21/02* (2006.01)
*G06F 1/08* (2006.01)

(56) References Cited

U.S. PATENT DOCUMENTS

| | | | | |
|---|---|---|---|---|
| 5,524,035 | A * | 6/1996 | Casal | H03K 5/1565 |
| | | | | 377/47 |
| 5,905,411 | A * | 5/1999 | Murakami | H03L 7/0991 |
| | | | | 331/18 |
| 6,630,849 | B2 * | 10/2003 | Dellow | H03K 21/10 |
| | | | | 327/115 |
| 6,895,070 | B2 * | 5/2005 | Kobayashi | H03K 21/00 |
| | | | | 365/236 |
| 7,881,422 | B1 * | 2/2011 | Chiang | H03K 23/544 |
| | | | | 377/47 |
| 8,368,436 | B1 | 2/2013 | Chu | |
| 8,378,719 | B1 | 2/2013 | Pace | |
| 8,698,525 | B2 | 4/2014 | Velayuthan | |
| 8,744,037 | B2 | 6/2014 | Hauck | |
| 8,829,853 | B2 * | 9/2014 | Hill | B60L 5/42 |
| | | | | 104/34 |
| 8,829,953 | B1 | 9/2014 | Ali | |
| 2007/0040593 | A1 * | 2/2007 | Khanoyan | H03K 21/10 |
| | | | | 327/117 |
| 2008/0219399 | A1 | 9/2008 | Nary | |
| 2015/0193373 | A1 * | 7/2015 | Ngo | G06F 13/4291 |
| | | | | 710/110 |

\* cited by examiner

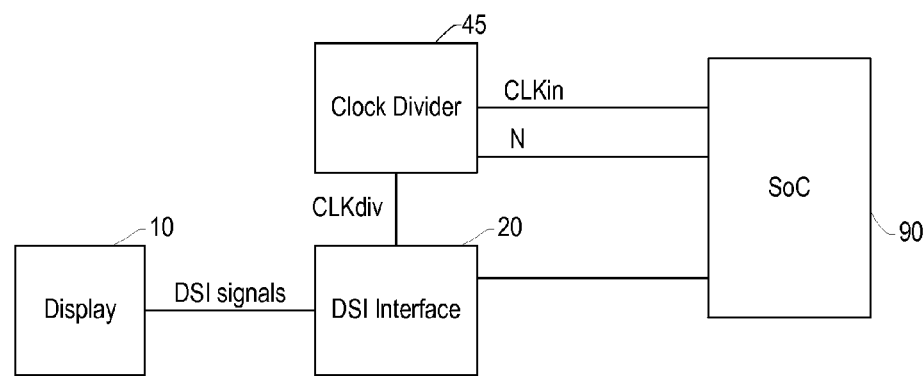
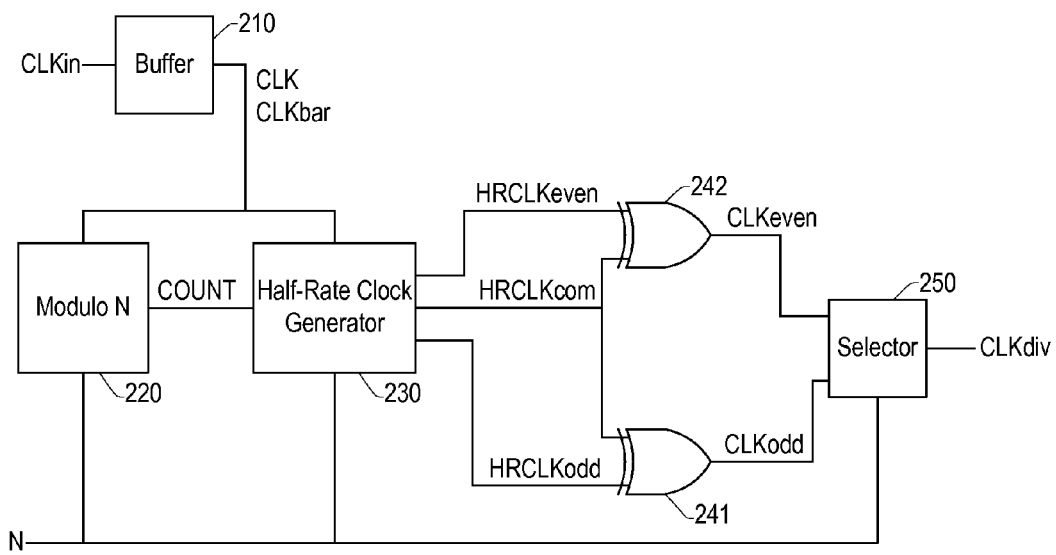
FIG. 1
FIG. 2

HIGH-SPEED PROGRAMMABLE CLOCK DIVIDER

BACKGROUND

Field

The present invention relates to electronic circuits and, more particularly, to programmable clock dividers.

Background

A programmable clock divider receives an input clock signal at an input frequency and produces an output clock signal at an output frequency with the ratio of the input frequency to the output frequency set by a programmable divide ratio. Programmable clock dividers are used in many electronic devices. For example, a programmable clock divider can be used to implement multiple frequencies of operation for a Display Serial Interface (DSI) link between a processor and a display device. DSI is an interface standard established by the Mobile Industry Processor Interface (MIPI) Alliance. The DSI link may operate at many different frequencies, for example, depending on characteristics of the display, with a clock signal toggling at the different frequencies produced by a programmable clock divider.

FIG. 1 is a block diagram of an electronic system that includes a programmable clock divider. The system includes a DSI interface 20. The DSI interface 20 is coupled to DSI signals for communication with a display device 10. The DSI interface 20 may receive data signals and format the signals for communication according to DSI specifications. The DSI interface 20 receives a clock signal (CLKdiv) for use in performing its functions.

A programmable clock divider 45 receives an input clock signal (CLKin) and produces an output clock signal (CLKdiv). The programmable clock divider 45 receives a divide ratio signal (N) that indicates the ratio of the frequency of the input clock signal to the frequency of the output clock signal.

The system of FIG. 1 also includes an SoC block 90. The SoC block 90 provides other functions of the electronic system. The SoC block 90 may supply data to the DSI interface 20. The SoC block 90 may also supply the divide ratio signal and the input clock signal to the programmable clock divider 45.

The clock signal used by the DSI interface 20 may toggle at a wide range of frequencies, for example, 2.5 GHz to 80 MHz. A programmable clock divider that can operate at such high frequencies may be difficult to implement. Additionally, the system may be improved when the delay of the programmable clock divider 45 from the input clock signal to the output clock signal is constant. For example, the SoC block 90 may time some operations using the input clock signal supplied to the programmable clock divider 45. The delay of the programmable clock divider 45 effects the timing of data signals between the SoC block 90 and the DSI interface 20. Thus, a constant delay of programmable clock divider 45 may allow the system to operate at high frequencies. Additionally, functions of circuits in the DSI interface 20 may be improved when the duty cycle of the clock signal used is near 50%. Providing a 50% duty cycle output clock signal is more difficult when the divide ratio is an odd number. Thus, providing a programmable clock divider that produces an output clock signal with a 50% duty cycle, has a constant delay, and operates at high frequencies is valuable.

Many other systems use programmable clock dividers and may have similar requirements.

SUMMARY

In one aspect, a programmable clock divider is provided for receiving an input clock signal at an input frequency and producing an output clock signal at an output frequency, the ratio of the input frequency to the output frequency set by a programmable divide ratio The programmable clock divider includes: a modulo N counter configured to produce a count signal that counts modulo the divide ratio; a half-rate clock signal generator configured to produce a common half-rate clock signal, an even half-rate clock signal, and an odd half-rate clock signal that toggle at one-half the rate of the output clock signal; a first exclusive OR gate having inputs coupled to the common half-rate clock signal and the even half-rate clock signal and an output driving an even clock signal; a second exclusive OR gate having inputs coupled the common half-rate clock signal and the odd half-rate clock signal and an output driving an even clock signal; and a selector configured to produce the output clock signal by selecting the even clock signal when the divide ratio is even and selecting the odd clock signal when the divide ratio is odd.

In one aspect, a method is provided for dividing an input clock signal by a programmable divide ratio. The method includes: counting, on edges of the input clock signal, modulo the divide ratio to produce a count signal; producing, based on the count signal and the divide ratio, a common half-rate clock signal, an even half-rate clock signal, and an odd half-rate clock signal that toggle at one-half the rate of the output clock signal; and producing an output clock signal using on the common half-rate clock signal, the even half-rate clock signal, and the odd half-rate clock signal.

In one aspect, an apparatus is provided for receiving an input clock signal at an input frequency and producing an output clock signal at an output frequency, the ratio of the input frequency to the output frequency set by a programmable divide ratio. The apparatus includes: counting, on edges of the input clock signal, modulo the divide ratio to produce a count signal; producing, based on the count signal and the divide ratio, a common half-rate clock signal, an even half-rate clock signal, and an odd half-rate clock signal that toggle at one-half the rate of the output clock signal; and producing an output clock signal using on the common half-rate clock signal, the even half-rate clock signal, and the odd half-rate clock signal.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which:

FIG. 1 is a block diagram of an electronic system that includes a programmable clock divider:

FIG. 2 is a block diagram of programmable clock divider according to a presently disclosed embodiment;

DETAILED DESCRIPTION

Figure 3:
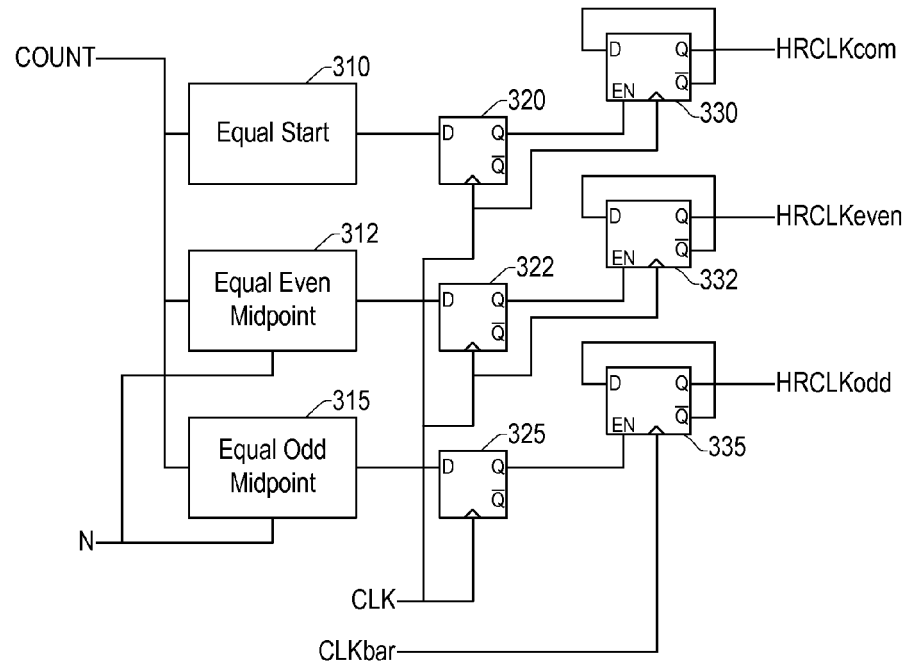
FIG. 3 is block diagram of a half-rate clock signal generator according to a presently disclosed embodiment.

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

FIG. 2 is a block diagram of programmable clock divider according to a presently disclosed embodiment. The programmable clock divider may be used to implement to the programmable clock divider 45 of the electronic system of FIG. 1. The programmable clock divider of FIG. 2 may be implemented, for example, in a complementary metal-oxide semiconductor (CMOS) process. The programmable clock divider receives an input clock signal (CLKin) and a divide ratio signal (N) that indicates a divide ratio and produces an output clock signal (CLKdiv) that toggles at a frequency that is the frequency of the input clock signal divided by the divide ratio.

A buffer 210 receives the input clock signal and produces buffered clock signals for use by other circuits in the programmable clock divider. The buffer 210 may produce a complementary pair of buffered clock signals. Complementary buffered clock signals may be referred to as a positive buffered clock signal (CLK) and a negative buffered clock signal (CLKbar). In addition to buffering, the buffer 210 may include gating circuits to disable the buffered clock signals, for example, in a low-power mode.

A modulo N counter 220 produces a count signal (COUNT) that counts modulo N. The count signal may have a bit width according to a range of values of the divide ratio. In an example embodiment, the count signal is four bits wide. The modulo N counter 220 counts each cycle of the buffered clock signals. For example, the count signal may cycle from 1 to N repeatedly. Other count sequences (e.g., N−1 to 0) may also be used. The modulo value is specified by the divide ratio.

A half-rate clock signal generator 230 produces three half-rate clock signals based on the count output from the modulo N counter 220 and the divide ratio. Operations of the half-rate clock signal generator 230 are timed by the buffered clock signals. The half-rate clock signals toggle at one-half the frequency of the output clock signal. The phases of the half-rate clock signals are timed so that pairs of the half-rate clock signals can be combined to produce the output clock signal.

Different pairs of the half-rate clock signals are used for even and odd divide ratios. A first one of the half-rate clock signals (common half-rate clock signal HRCLKcom) is common to both even and odd divide ratios. A second one of the half-rate clock signals (even half-rate clock signal HRCLKeven) is used for even divide ratios. A third one of the half-rate clock signals (odd half-rate clock signal HRCLKodd) is used for odd divide ratios.

The pairs of the half-rate clock signals are exclusive ORed to produce the output clock signal. A first exclusive OR gate 242 receives the common half-rate clock signal and the even half-rate clock signal and produces an even clock signal (CLKeven) that is used to produce the output clock signal when the divide ratio is even. A second exclusive OR gate 241 receives the common half-rate clock signal and the odd half-rate clock signal and produces an odd clock signal (CLKodd) that is used to produce the output clock signal when the divide ratio is odd.

A selector 250 produces the output clock signal by selecting the even clock signal when the divide ratio is even and the odd clock signal when the divide ratio is odd.

Figure 4:
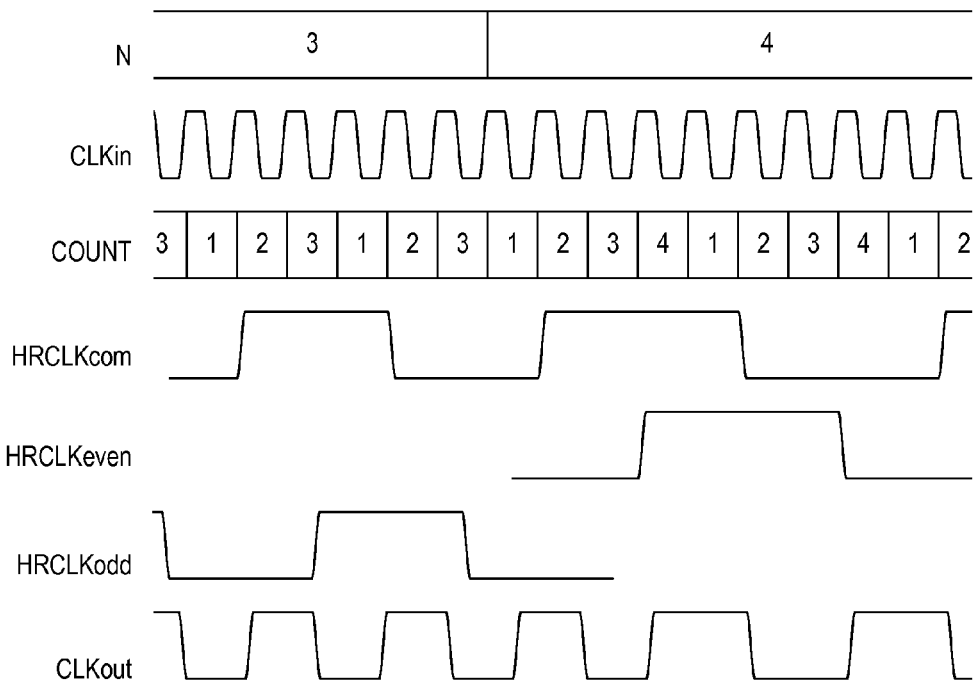
FIG. 4 is a waveform diagram illustrate operation of a programmable clock divider according to a presently disclosed embodiment.

FIG. 4 is waveform diagram that illustrates operation of the programmable clock divider. The waveforms illustrate a divide ratio of three and a divide ratio of four. The waveforms of FIG. 4 are for circuit delays that are small (much less that the clock period) for clear illustration; however, actual circuit delays may be comparable to a clock period.

As shown, there are quadrature timing relationships (one-quarter period phase shift) between the common half-rate clock signal and the even half-rate clock signal and between the common half-rate clock signal and the odd half-rate clock signal. The quadrature timing relationships provides 50% duty cycles on output clock signal for both even and odd divide ratios. To achieve the quadrature timing relationships, the common half-rate clock signal and the even half-rate clock signal toggle on rising edges of the input clock signal and the odd half-rate clock signal toggles on falling edges of the input clock signal.

For odd divide ratios, the even half-rate clock signal is not used and its waveform may be chosen for convenient implementation. Similarly, for even divide ratios, the odd half-rate clock signal is not used and its waveform may be chosen for convenient implementation.

Delay from input clock signal to output clock signal does not depend on the value of the divide ratio. This can simplify timing closure and allow high frequency operation.

FIG. 3 is block diagram of a half-rate clock signal generator according to a presently disclosed embodiment. The half-rate clock signal generator may be used to implement to the half-rate clock signal generator 230 of the programmable clock divider of FIG. 2. The half-rate clock signal generator of FIG. 3 receives a count signal (COUNT), a divide ratio signal (N), and complementary buffered clock signals (CLK and CLKbar) and produces three half-rate clock signals: a common half-rate clock signal (HRCLKcom), an even half-rate clock signal (HRCLKeven), and an odd half-rate clock signal (HRCLKodd). The complementary buffered clock signals include a positive buffered clock signal (CLK) and a negative buffered clock signal (CLKbar). The half-rate clock signal generator can generate signals as illustrated in FIG. 4.

The three half-rate clock signals are supplied by three toggle flip-flops. A first toggle flip-flop 330 produces the common half-rate clock signal. A second toggle flip-flop 332 produces the even half-rate clock signal. A third toggle flip-flop 335 produces the odd half-rate clock signal. When the toggle flip-flops toggle is determined from the count signal and the divide ratio. The count signal is compared to values derived from the divide ratio to control when the toggle flip-flops toggle.

A first comparator 310 controls when the first toggle flip-flop 330, which produces the common half-rate clock signal, toggles. The first comparator 310 compares the value of the count signal to its starting value (1 for the waveforms illustrated is FIG. 4) and produces an active output when the values are equal. The output of the first comparator 310 is saved in a first pipeline flip-flop 320 on rising edges of the positive buffered clock signal. The first toggle flip-flop 330 is enabled by the output of the first pipeline flip-flop 320 and clocked by the positive buffered clock signal. The use of the pipeline flip-flop can improve setup and hold timing and thereby increase maximum operating frequency.

A second comparator 312 controls when the second toggle flip-flop 332, which produces the even half-rate clock signal, toggles. The second comparator 312 compares the value of the count signal to its midpoint value and produces an active output when the values are equal. The midpoint value may be selected to be N/2+1 (3 for the divide ratio of 4 illustrated in FIG. 4) in the illustrated embodiment. The output of the second comparator 312 is saved in a second pipeline flip-flop 322 on rising edges of the positive buffered clock signal. The second toggle flip-flop 332 is enabled by the output of the second pipeline flip-flop 322 and clocked by the positive buffered clock signal.

A third comparator 315 controls when the third toggle flip-flop 335, which produces the odd half-rate clock signal, toggles. The third comparator 315 compares the value of the count signal to its midpoint value and produces an active output when the values are equal. The midpoint value may be selected to be (N+1)/2+1 (3 for the divide ratio of 3 illustrated in FIG. 4) in the illustrated embodiment. The output of the third comparator 315 is saved in a third pipeline flip-flop 325 on rising edges of the positive buffered clock signal. The third toggle flip-flop 335 is enabled by the output of the third pipeline flip-flop 325 and clocked by the negative buffered clock signal. Use of the negative buffered clock signal to clock the third toggle flip-flop 335 delays the odd half-rate clock signal by one-half the period of the input clock signal so that when odd half-rate clock signal is exclusive ORed with the common half-rate clock signal, the resulting signal has a 50% duty cycle.

The values used in the comparator are exemplary. The comparison values can be adjusted by corresponding amounts to produce clock signals with the same (but shifted with respect to the count signal) waveforms. Additionally, the comparison values can be adjusted when a different number of pipeline flip-flops are used.

The programmable clock divider of FIG. 2 using the half-rate clock signal generator of FIG. 3 produces the output clock signal with the delay from the input clock signal to the output clock signal being independent of the divide ratio. This delay relationship may be referred to as constant delay. However, the delay may vary with operating conditions, for example, temperature and supply voltage, of the programmable clock divider. The delay from the input clock signal to the output clock signal includes delays in the clock buffer, the toggle flip-flops, the exclusive OR gates, and the selector. These delays may vary slightly, for example, the delay of the selector to its output may be different between the even clock signal and the odd clock signal. Such delay differences can be small, for example, less than the delay of one logic gate.

The programmable clock divider of FIG. 2 using the half-rate clock signal generator of FIG. 3 can also operate at high frequency, for example, 3.5 GHz. Additionally, the output clock has a 50% duty cycle for all divide ratios. Similar to the constant delay, the duty cycle may vary slightly.

Figure 5:
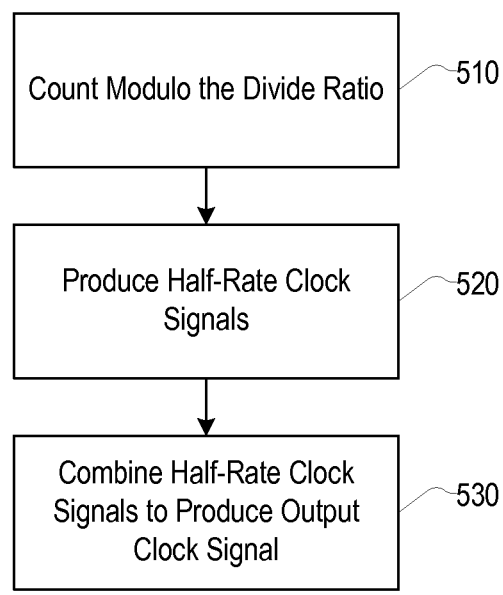
FIG. 5 is a flowchart of a process for dividing a clock signal by a programmable integer value according to a presently disclosed embodiment.

FIG. 5 is a flowchart of a process for dividing a clock signal by a programmable integer value according to a presently disclosed embodiment. The process of FIG. 5 may be performed with any suitable circuit, however, to provide a specific example, the process will be described with reference to the programmable clock divider of FIG. 2 and half-rate clock signal generator of FIG. 3. The process of FIG. 5 receives an input clock signal (CLKin) and a divide ratio signal (N) that indicates a divide ratio and produces an output clock signal (CLKdiv) that toggles at a frequency that is the frequency of the input clock signal divided by the divide ratio.

In step 510, the process counts modulo N. For example, the modulo N counter 220 may produce a count signal that counts modulo the divide ratio with the value of the count signal changing on transitions of the input clock signal.

In step 520, the process uses the count signal and divide ratio to produce a common half-rate clock signal, an even half-rate clock signal, and an odd half-rate clock signal that toggle at one-half the rate of the output clock signal. For example, the half-rate clock signal generator of FIG. 3 can produce the three half-rate clock signals using toggle flip-flops that are enabled based on comparison of the value of the count signal starting and midpoint values of the count signal.

In step 530, the process uses the common half-rate clock signal, the even half-rate clock signal, and the odd half-rate clock signal to produce the output clock signal. For example, the first exclusive OR gate 242 can combine the common half-rate clock signal and the even half-rate clock signal to produce the output clock signal when the divide ratio is even and the second exclusive OR gate 241 can combine the common half-rate clock signal and the odd half-rate clock signal to produce the output clock signal when the divide ratio is odd.

The process of FIG. 5 may be modified, for example, by adding or altering steps. Additionally, steps may be performed concurrently.

Although particular embodiments are described above, many variations are possible, including, for example, those with different signal polarities. Additionally, signal buffers and pipeline stages may be added, moved, or deleted. Furthermore, functions described as be performed by one block may be moved to another block or distributed across blocks. Additionally, features of the various embodiments may be combined in combinations that differ from those described above.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A programmable clock divider for receiving an input clock signal at an input frequency and producing an output clock signal at an output frequency, the ratio of the input frequency to the output frequency set by a programmable divide ratio, the programmable clock divider comprising:
   a modulo N counter configured to produce a count signal that counts modulo the programmable divide ratio;
   a half-rate clock signal generator configured to produce a common half-rate clock signal, an even half-rate clock signal, and an odd half-rate clock signal that each toggle at one-half the rate of the output clock signal;
a first exclusive OR gate having inputs coupled to the common half-rate clock signal and the even half-rate clock signal and an output driving an even clock signal;
a second exclusive OR gate having inputs coupled to the common half-rate clock signal and the odd half-rate clock signal and an output driving an odd clock signal; and
a selector configured to produce the output clock signal by selecting the even clock signal when the programmable divide ratio is even and selecting the odd clock signal when the programmable divide ratio is odd.

2. The programmable clock divider of claim 1, wherein the delay from the input clock signal to the output clock signal is independent of the value of the programmable divide ratio.

3. The programmable clock divider of claim 1, wherein the duty cycle of the output clock signal is 50% independent of the value of the programmable divide ratio.

4. The programmable clock divider of claim 1, wherein the common half-rate clock signal and the even half-rate clock signal have quadrature timing relationship for even divide ratios, and the common half-rate clock signal and the odd half-rate clock signal have quadrature timing relationship for odd divide ratios.

5. The programmable clock divider of claim 1, wherein the half-rate clock signal generator comprises:
a first toggle flip-flop clocked on rising edges of the input clock signal and configured to produce the common half-rate clock signal;
a second toggle flip-flop clocked on rising edges of the input clock signal and configured to produce the even half-rate clock signal; and
a third toggle flip-flop clocked on falling edges of the input clock signal and configured to produce the odd half-rate clock signal.

6. The programmable clock divider of claim 5, wherein the half-rate clock signal generator further comprises:
a first comparator configured to compare the value of the count signal to a starting value of the count signal and produce an enable for the first toggle flip-flop based on the comparison;
a second comparator configured to compare the value of the count signal to an even midpoint value of the count signal and produce an enable for the second toggle flip-flop based on the comparison; and
a third comparator configured to compare the value of the count signal to an odd midpoint value of the count signal and produce an enable for the third toggle flip-flop based on the comparison.

7. The programmable clock divider of claim 6, wherein the half-rate clock signal generator further comprises:
a first pipeline flip-flop coupled between the first comparator and the first toggle flip-flop;
a second pipeline flip-flop coupled between the second comparator and the second toggle flip-flop; and
a third pipeline flip-flop coupled between the third comparator and the third toggle flip-flop.

8. A method for dividing an input clock signal by a programmable divide ratio, the method comprising:
counting, on edges of the input clock signal, modulo the programmable divide ratio to produce a count signal;
producing, based on the count signal and the programmable divide ratio, a common half-rate clock signal, an even half-rate clock signal, and an odd half-rate clock signal that each toggle at one-half the rate of the output clock signal; and
producing an output clock signal using the common half-rate clock signal, the even half-rate clock signal, and the odd half-rate clock signal.

9. The method of claim 8, wherein producing the output clock signal comprises:
combining the common half-rate clock signal and the even half-rate clock signal to produce an even clock signal;
combining the common half-rate clock signal and the odd half-rate clock signal to produce an odd clock signal; and
selecting, as the output clock signal, the even clock signal when the programmable divide ratio is even and selecting, as the output clock signal, the odd clock signal when the programmable divide ratio is odd.

10. The method of claim 8, wherein the delay from the input clock signal to the output clock signal is independent of the value of the programmable divide ratio.

11. The method of claim 8, wherein the duty cycle of the output clock signal is 50% independent of the value of the programmable divide ratio.

12. The method of claim 8, wherein the common half-rate clock signal and the even half-rate clock signal have quadrature timing relationship for even divide ratios, and the common half-rate clock signal and the odd half-rate clock signal have quadrature timing relationship for odd divide ratios.

13. The method of claim 8, wherein:
the common half-rate clock signal transitions at rising edges of the input clock signal;
the even half-rate clock signal transitions at rising edges of the input clock signal; and
the odd half-rate clock signal transitions at falling edges of the input clock signal.

14. The method of claim 8, wherein:
the common half-rate clock signal transitions after the count signal equals a starting value of the count signal;
the even half-rate clock signal transitions after the count signal equals an even midpoint value of the count signal; and
the odd half-rate clock signal transitions after the count signal equals an odd midpoint value of the count signal.

15. An apparatus for receiving an input clock signal at an input frequency and producing an output clock signal at an output frequency, the ratio of the input frequency to the output frequency set by a programmable divide ratio, the apparatus comprising:
a modulo N counter means for producing a count signal that counts modulo the programmable divide ratio;
a half-rate clock signal generator means for producing a common half-rate clock signal, an even half-rate clock signal, and an odd half-rate clock signal that each toggle at one-half the rate of the output clock signal;
a first exclusive OR gate having inputs coupled to the common half-rate clock signal and the even half-rate clock signal and an output driving an even clock signal;
a second exclusive OR gate having inputs coupled the common half-rate clock signal and the odd half-rate clock signal and an output driving an odd clock signal; and
a selector configured to produce the output clock signal by selecting the even clock signal when the programmable divide ratio is even and selecting the odd clock signal when the programmable divide ratio is odd.

16. The apparatus of claim 15, wherein the delay from the input clock signal to the output clock signal is independent of the value of the programmable divide ratio.

17. The apparatus of claim 15, wherein the duty cycle of the output clock signal is 50% independent of the value of the programmable divide ratio.

18. The apparatus of claim 15, wherein the common half-rate clock signal and the even half-rate clock signal have quadrature timing relationship for even divide ratios, and the common half-rate clock signal and the odd half-rate clock signal have quadrature timing relationship for odd divide ratios.

19. The apparatus of claim 15, wherein the half-rate clock signal generator comprises:
   a first toggle flip-flop clocked on rising edges of the input clock signal and configured to produce the common half-rate clock signal;
   a second toggle flip-flop clocked on rising edges of the input clock signal and configured to produce the even half-rate clock signal; and
   a third toggle flip-flop clocked on falling edges of the input clock signal and configured to produce the odd half-rate clock signal.

20. The apparatus of claim 19, wherein the half-rate clock signal generator further comprises:
   a first comparator configured to compare the value of the count signal to a starting value of the count signal and produce an enable for the first toggle flip-flop based on the comparison;
   a second comparator configured to compare the value of the count signal to an even midpoint value of the count signal and produce an enable for the second toggle flip-flop based on the comparison; and
   a third comparator configured to compare the value of the count signal to an odd midpoint value of the count signal and produce an enable for the third toggle flip-flop based on the comparison.

21. The apparatus of claim 20, wherein the half-rate clock signal generator further comprises:
   a first pipeline flip-flop coupled between the first comparator and the first toggle flip-flop;
   a second pipeline flip-flop coupled between the second comparator and the second toggle flip-flop; and
   a third pipeline flip-flop coupled between the third comparator and the third toggle flip-flop.

* * * * *